United States Patent [19]
Sato et al.

[11] Patent Number: 5,803,972
[45] Date of Patent: Sep. 8, 1998

[54] SEMICONDUCTOR FABRICATION APPARATUS

[75] Inventors: Mitsuo Sato, Zama; Hiroshige Uchida, Yokohama, both of Japan

[73] Assignee: Kabushiki Kaisha Toshiba, Kawasaki, Japan

[21] Appl. No.: 202,236

[22] Filed: Feb. 25, 1994

[30] Foreign Application Priority Data

Mar. 2, 1993 [JP] Japan .................................. 5-040967

[51] Int. Cl.$^6$ .................................................. B05C 11/00
[52] U.S. Cl. ........................ 118/712; 118/668; 118/686; 118/671; 134/902
[58] Field of Search .................................... 118/668, 686, 118/671, 712; 437/7; 364/520; 134/902

[56] References Cited

U.S. PATENT DOCUMENTS

| | | | |
|---|---|---|---|
| 3,889,355 | 6/1975 | Aronsatein et al. | 29/25.01 |
| 4,623,975 | 11/1986 | Kagami | 364/500 |
| 4,770,121 | 9/1988 | Ebata et al. | 118/686 |
| 4,964,071 | 10/1990 | Grosvenor | 364/500 |
| 5,246,524 | 9/1993 | Kuroda et al. | 118/686 |

*Primary Examiner*—Hien Tran
*Attorney, Agent, or Firm*—Oblon, Spivak, McClelland, Maier & Neustadt, P.C.

[57] ABSTRACT

A semiconductor fabrication apparatus including a plurality of process units for sequentially processing a semiconductor wafer. A heating unit, a cooling unit, a resin coating unit, and a resin hardening unit are included. Also, a sender unit and a process control unit are included besides the process units. In the sender unit, a wafer size sensor is provided in order to detect the size of an original wafer. The wafer size data detected by the sensor is held and processed in the process control unit. Finding the original size of a wafer, the process control unit gives instructions to process units so as to set a correct stop position of the wafer and to select suitable wafer supporting means according to the detected wafer size. Thus, the apparatus is automatically set to a correct state for uniformly processing the semiconductor wafer. In some units, there are provided sensors to find the size of the supporting means, for example, carrier guides, forks, and stoppers. When the information from these sensors do not correspond to the wafer size detected by the wafer size sensor, the process control unit interrupts fabrication processes under execution and gives an alarm to operators.

10 Claims, 3 Drawing Sheets

5,803,972

SEMICONDUCTOR FABRICATION APPARATUS

BACKGROUND OF THE INVENTION

1. Field of the Invention

This invention relates to a semiconductor fabrication apparatus for processing semiconductor wafers so as to form semiconductor devices. In particular, this invention relates to the semiconductor fabrication apparatus which is capable of automatically changing the stop position of a wafer in a process unit as well as of automatically selecting correct carrier guides, forks, and stoppers used in process units according to the wafer size under treatment. Further, this invention relates to the semiconductor fabrication apparatus which is capable of automatically stopping fabrication processes when an emergency occurs and giving an alarm to operators.

2. Description of the Prior Art

FIG. 1 shows the structure of a prior art semiconductor fabrication apparatus of this kind. As shown, this apparatus includes various processing units such as a sender unit 101, a heating unit 102, a first cooling unit 103, a polyimide resin coating unit 104, a polyimide resin hardening unit 105, a second cooling unit 106, and a receiver unit 107. This apparatus also includes a process control unit 108 for controlling the operation of each unit.

Semiconductor wafers are stored in an external carrier 10. Receiving control signal 15 from process control unit 108, sender unit 101 takes out semiconductor wafers stored in carrier 10 one by one and sends them to heating unit 102. Each wafer is heat-treated in unit 102 and cooled in unit 103 respectively. The heat treatment and cooling are carried out under the control of signals 25 and 35 from process control unit 108. Next, the wafer is sent to unit 104 to undergo a polyimide resin coating process. This resin on the wafer is hardened in unit 105 and then sent to unit 106 to undergo a cooling process again. These processes are carried out under the control of signals 45, 55, and 65 from process control unit 108. Then, the wafers undergone respective processes are sent back to carrier 10 by receiver unit 107 one by one and stored there. This process is carried out under the control of signal 75 from process control unit 108.

A microcomputer is included in process control unit 108 so as to control the operation of each unit with said control signals 15, 25, 35, 45, 55, 65, and 75.

In order to uniformly treat each wafer in heating unit 102, coating unit 104, and hardening unit 105 of the semiconductor fabrication apparatus mentioned above, the wafer stop position in each unit is manually set by operators according to the inch size of the wafer. Also, carrier guides in units 102 and 105 and forks and stoppers in unit 104 are manually changed into suitable ones by operators according to the size of the wafer.

In the above mentioned semiconductor fabrication apparatus, however, each processing unit does not have a means to recognize the size of a wafer by itself. In addition, the information concerning about the wafer size is not transferred throughout the units. As a result, the apparatus does not stop fabrication processes even in the case where wrong carrier guides, forks, or stoppers, which do not correspond to the wafer having a certain size, are used. Consequently, the wafer may by treated improperly throughout the whole fabrication processes.

In addition, if an accident occurs during a fabrication process, the process under execution is continued unless an operator brings to an emergency halt. This fact may cause a serious damage to the semiconductor fabrication apparatus and also incurs danger to operators.

SUMMARY OF THE INVENTION

This invention has been made to overcome the above mentioned problems of the prior art apparatus.

Therefore, the objective of this invention is to provide a semiconductor fabrication apparatus which is capable of automatically changing the stop position of a wafer in a processing unit according to the size of the wafer.

Another objective of this invention is to provide a semiconductor fabrication apparatus which is capable of automatically selecting correct carrier guides, forks and stoppers according to the size of a wafer under treatment.

Still another objective of this invention is to provide a semiconductor fabrication apparatus which is capable of automatically interrupting the fabrication process under execution in case of emergency and informing operators of the emergency so as to safely fabricate semiconductor devices.

In order to realize the above mentioned objectives, the semiconductor fabrication apparatus of this invention has a wafer size sensor, for example, in a sender unit. The apparatus still has sensors for detecting the size of carrier guides, forks, and stoppers used in order to support wafers in process units. The data detected by said sensors are stored and processed in a process control unit so as to find control signals to operate each process unit correctly. According to these signals, the apparatus of this invention can automatically set the correct stop position of the wafer in a unit and select suitable carrier guides, forks, and stoppers. As a result, semiconductor fabrication processes are efficiently carried out using the apparatus of this invention.

On the other hand, if it is found by the sensors that the size of carrier guides, forks, or stoppers does not correspond to the detected size of a wafer during a semiconductor fabrication process, this apparatus automatically stops the fabrication process and gives an alarm to operators. Thus, the apparatus of this invention can safely execute semiconductor fabrication processes.

These and other objectives, features, and advantages of the present invention will be more apparent from the following detailed description of preferred embodiments in conjunction with the accompanying drawings.

DETAILED DESCRIPTION OF THE EMBODIMENT

Figure 1:
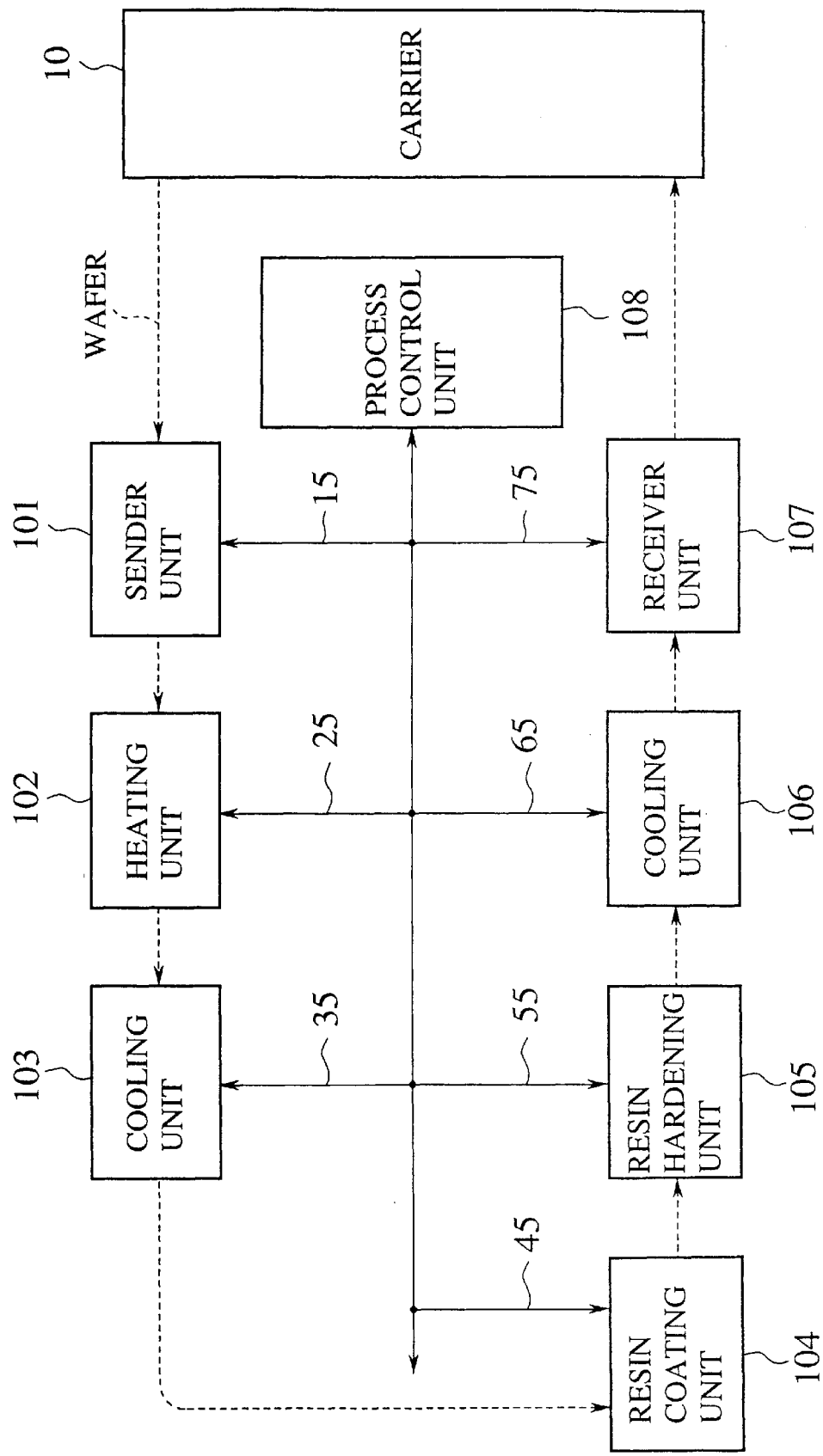
FIG. 1 is a block diagram showing the structure of a prior art semiconductor fabrication apparatus.
Figure 2:
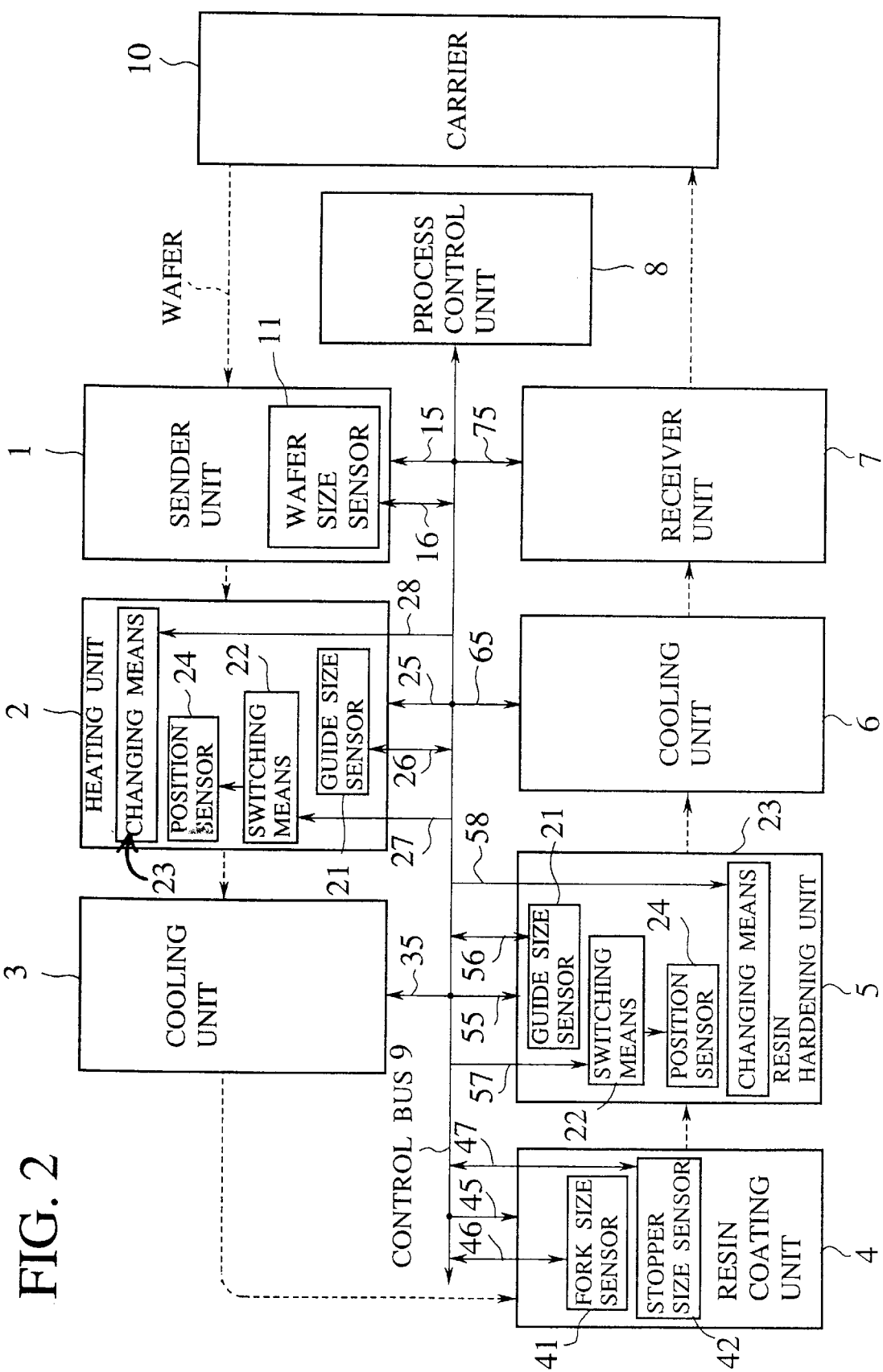
FIG. 2 is a block diagram showing the structure of a semiconductor fabrication apparatus according to one embodiment of the present invention.

In FIG. 2, the structure of a semiconductor fabrication apparatus is shown according to one embodiment of the present invention. As shown, the apparatus has the following units for processing semiconductor wafers: sender unit 1; heating unit 2; first cooling unit 3; coating unit 4 of polyimide resin; hardening unit 5 of polyimide resin; second cooling unit 6; receiver unit 7; process control unit 8; and control bus 9 which connects units 1 to 7 with process control unit 8.

Sender unit 1 takes out semiconductor wafers from carrier 10 one by one according to control signal 15 from process control unit 8. A wafer size sensor (inch size sensor) 11 is provided in unit 1 so as to detect the original size of the wafer taken out from carrier 10. The detected information concerning about the wafer size is sent to process control unit 8 through signal 16.

In heating unit 2, the wafer sent from sender unit 1 is held with a pair of carrier guides by vacuum attraction and heat-treated on a hot plate according to control signal 25 from process control unit 8. In this unit 2, a carrier guide size sensor 21 is provided in order to detect the size of the carrier guides which are now in use. The information obtained from sensor 21 is sent to process control unit 8 as signal 26 through control bus 9. In addition, unit 2 has changing means 23 for carrier guides which are operated by control signal 28 from process control unit 8. Unit 2 still has a position sensor 24 for determining the stop position of the wafer in this unit and a switching means 22 for controlling position sensor 24 so as to change the wafer stop position according to the wafer size. This switching means 22 is operated by control signal 27 from process control unit 8.

In cooling unit 3, the wafer transferred from unit 2 is cooled.

In resin coating unit 4, polyimide resin is painted on a surface of the wafer which is transferred from unit 3. This coating process is carried out according to control signal 45 from process control unit 8. In this unit 4, there are provided a fork size sensor 41 for detecting the size of forks which are used to hold the wafer, and a stopper size sensor 42 for detecting the size of stoppers which are used to position the wafer in unit 4. The detected signals from sensors 42 and 43 are sent to process control unit 8 through signals 46 and 47.

In unit 5, the polyimide resin painted on the wafer surface is hardened according to control signal 55 from process control unit 8. In this unit 5, there are provided carrier guide size sensor 21 controlled by signed 56, changing means 22 for carrier guides, position sensor 24, and switching means 23. These means 22 and 23 are controlled by signals 57 and 58 obtained from process control unit 8 through control bus 9.

In unit 6, the wafer transferred from unit 5 is cooled again under the control of process control unit 8 through signal 65. Then, the wafer is stored in carrier 10 one by one using receiver unit 7.

process control unit 8 includes a microcomputer for controlling the operation of the entire fabrication processes, which are carried out using units 1 to 7, through control bus 9.

Figure 3:
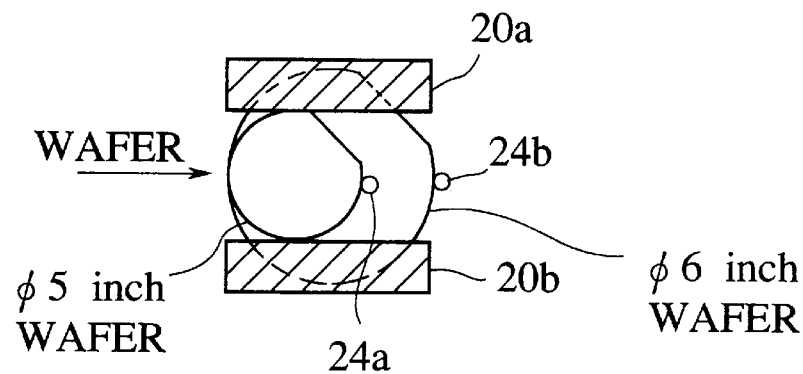
FIG. 3 is a view for explaining how to change stop positions of a wafer in a process unit.

As shown in FIG. 3, position sensor 24 in unit 2 or 5 has two sensor heads 24a and 24b, one of which shows the stop position of a five-inch wafer and the other of which shows the stop position of a six-inch wafer, for example. When a five-inch wafer is detected by wafer size sensor 11 in unit 1, switching means 22 receives signal 27 from process control unit 8 and sets sensor head 24a to an on-state. On the other hand, when a six-inch wafer is detected by wafer size sensor 11 in unit 1, switching means 22 receives signal 27 from process control unit 8 and sets sensor head 24b to an on-state. Thus, the proper stop position of the wafer transferred from unit 1 or unit 4 is automatically determined in unit 2 or 5 according to the detected wafer size.

Figure 4A:
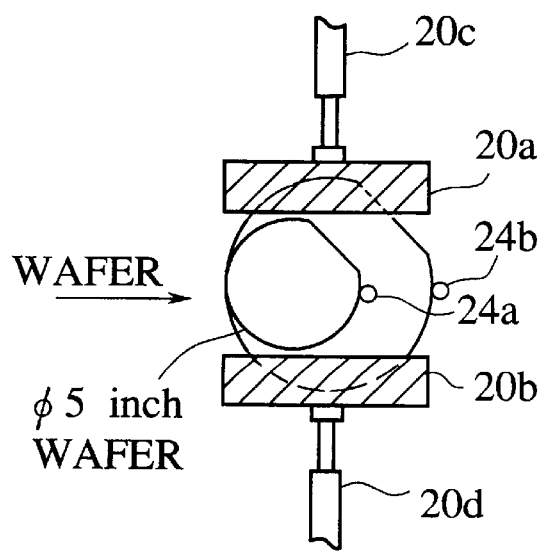
FIGS. 4a and 4b are views for explaining the mechanism of automatic guiding of a wafer in a process unit.
Figure 4B:
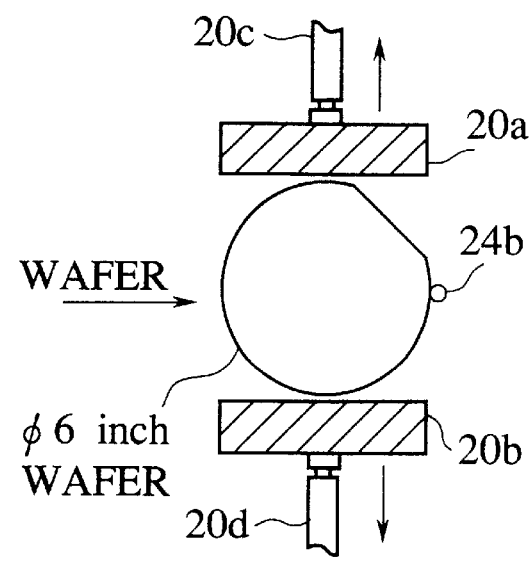

FIGS. 4a and 4b show the mechanism of automatic guiding of a wafer in unit 2 and unit 5. As shown in these figures, a wafer is held by a pair of carrier guides 20a and 20b by vacuum attraction using air cylinders 20c and 20d. The distance between two guides 20a and 20b are automatically controlled by changing means 23 according to the wafer size detected by wafer size sensor 11. For example, guides 20a and 20b are set as shown in FIG. 4a by changing means 23 when a five inch wafer is treated. On the other hand, guides 20a and 20b are set as shown in Fig. 4b when a six inch wafer is treated.

In this apparatus, as soon as sensor 11 finds the wafer size under treatment, process control unit 8 gives instructions to units 2 and 5 through control signals 27 and 57 so as to correctly set the wafer stop position by operating switching means 22. At the same time, by finding the size of carrier guides, forks, and stoppers using sensors 21, 41, and 42, carrier guides in units 2 and 5, forks and stoppers in unit 4 are automatically changed into correct ones under the control of process control unit 8. Thus, according to the wafer size, the setting of wafer stop positions in units 2 and 5 and the selection of correct carrier guides, forks, and stoppers are automatically and quickly carried out in this apparatus.

The execution of fabrication processes continues as far as the size of carrier guides detected by guide size sensors 21 in units 2 and 5 and the size of forks and stoppers detected by fork size sensor 41 and stopper size sensor 42 in unit 4 correspond to the wafer size detected by sensor 11. In other words, units 1 to 7 are normally operated by process control unit 8 to execute semiconductor fabrication processes so far as the data detected by sensors 21, 41, and 42 correspond to the wafer size data detected by sensor 11.

On the contrary, when the respective size of carrier guides, forks, and stoppers detected by sensors 21, 41, and 42 does not correspond to the detected wafer size by sensor 11, units 1 to 7 are set to a hold state by process control unit 8 so as to interrupt the process under execution. At the same time, process control unit 8 gives an alarm to operators.

In summary, the semiconductor fabrication apparatus of this invention has a means to detect the size of a wafer under treatment and to hold the detected data. In addition, this apparatus has means to automatically change the stop position of a wafer, carrier guides, forks, and stoppers according to the wafer size data. Therefore, the setting of a wafer position in a process unit and the selection of suitable carrier guides, forks, and stoppers are carried out automatically and quickly in the apparatus of this invention according to the wafer size under treatment. As a result, the apparatus of this invention can execute semiconductor fabrication processes efficiently.

In addition, when the size of carrier guides, forks, and stoppers does not correspond to the size of a wafer before treatment, this apparatus stops the semiconductor fabrication process under execution and informs operators of an emergency. Thus, the apparatus of this invention can execute semiconductor fabrication processes safely.

What is claimed is:

1. A semiconductor fabrication apparatus, comprising:
   a plurality of process units for sequentially processing a semiconductor wafer according to a size of said wafer; and
   a process control unit for controlling the operation of each unit;
   wherein at least one of said prosess units has a means for recognizing the size of said wafer under processing so as to correctly and automatically set a stop position of said wafer in said one of said process units, and means for supporting said wafer according to the size of said wafer.

2. The semiconductor fabrication apparatus as claimed in claim 1, wherein said process units include a sender unit, a heating unit, a resin coating unit, and a resin hardening unit.

3. The semiconductor fabrication apparatus as claimed in claim 2, wherein said at least one of said process units comprises said sender unit, and the means for recognizing comprises, has a wafer size sensor and said process control unit has a means for holding the wafer size data recognized by said wafer size sensor.

4. The semiconductor fabrication apparatus as claimed in claim 2, wherein each of said heating unit and resin hardening unit has a position sensor, and said position sensors are operated by said process control unit so as to correctly set the stop position of said wafer in said heating and resin hardening units according to the wafer size.

5. The semiconductor fabrication apparatus as claimed in claim 2, wherein said support means includes carrier guides in said heating and resin hardening units and forks and stoppers in said resin coating unit.

6. The semiconductor fabrication apparatus as claimed in claim 5, wherein said heating unit and resin hardening unit have a carrier guide sensor and a carrier guide changing means respectively in order to select correct carrier guides according to the wafer size.

7. The semiconductor fabrication apparatus as claimed in claim 5, wherein said resin coating unit has a fork size sensor and a stopper size sensor in order to select correct forks and stoppers according to the wafer size.

8. The semiconductor fabrication apparatus as claimed in claim 1, wherein said process control unit comprises means for interrupting the operation of a process unit under execution and giving an alarm to operators when the wafer size recognized by said means for recognizing does not correspond to size a of said support means.

9. A semiconductor fabrication apparatus for sequentially processing a semiconductor wafer in a plurality of processing units so as to form a semiconductor device, comprising:

a sender unit for taking out a semiconductor wafer from an external carrier, said sender unit having a wafer size sensor for recognizing a size of said wafer;

a heating unit for heating said wafer transferred from said sender unit, said heating unit having a first position sensor for setting a stop position of said wafer, a first means for switching said first position sensor, a first carrier guide size sensor, and a first means for changing carrier guides;

a resin coating unit for painting a resin on a surface of said wafer, said resin coating unit having a fork size sensor and a stopper size sensor;

a resin hardening unit for hardening said resin on said wafer surface, said resin hardening unit having a second position sensor, a second means for switching said second position sensor, a second carrier guide size sensor, and a second means for changing carrier guides; and a process control unit for controlling the operation of each unit;

wherein said process control unit receives information about wafer size from said sender unit and gives instructions to said first and second switching means in said heating and resin hardening units so as to operate said first and second position sensors to automatically set a correct stop position of the wafer according to the wafer size and also gives instructions to said first and second means for changing carrier guides in said heating and resin hardening units so as to select suitable carrier guides according to said wafer size.

10. The semiconductor fabrication apparatus as claimed in claim 9, wherein said process control unit further has a means for interrupting a fabrication process under execution and giving an alarm to operators when one of said sensors in said heating, resin coating, and resin hardening units finds information which does not correspond to the wafer size recognized by said wafer size sensor in said sender unit.

* * * * *